US012713871B2

(12) United States Patent
Cheng et al.

(10) Patent No.: US 12,713,871 B2
(45) Date of Patent: Aug. 18, 2026

(54) SYSTEMS AND METHODS FOR SEMICONDUCTOR WAFER TRANSPORT

(71) Applicant: Taiwan Semiconductor Manufacturing Company, Ltd., Hsinchu (TW)

(72) Inventors: Wen-Hao Cheng, Hsinchu (TW); Hsuan-Chih Chu, Hsinchu (TW); Yen-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 796 days.

(21) Appl. No.: 18/103,684

(22) Filed: Jan. 31, 2023

(65) Prior Publication Data

US 2024/0258142 A1 Aug. 1, 2024

(51) Int. Cl.

| | |
|---|---|
| ***H10P 72/00*** | (2026.01) |
| ***G06N 20/00*** | (2019.01) |
| ***H10P 72/50*** | (2026.01) |
| ***H10P 72/78*** | (2026.01) |

(52) U.S. Cl.

CPC ......... *H10P 72/0608* (2026.01); *G06N 20/00* (2019.01); *H10P 72/0602* (2026.01); *H10P 72/53* (2026.01); *H10P 72/78* (2026.01)

(58) Field of Classification Search

CPC ......... H01L 21/67265; H01L 21/67248; H01L 21/681; H01L 21/6838; H01L 21/67259; G06N 20/00

See application file for complete search history.

(56) References Cited

U.S. PATENT DOCUMENTS 6,024,393 A * 2/2000 Shamlou ............. H01L 21/6838 414/749.3
12,502,745 B2 * 12/2025 Akiyama ............... B23Q 11/10
2005/0072716 A1 * 4/2005 Quiles ............... H01L 21/67017 206/725
2009/0062959 A1 * 3/2009 Sakhare ............ H01L 21/67742 700/254
2010/0234992 A1 * 9/2010 Tseng ................ H01L 21/67265 901/50
2014/0277727 A1 * 9/2014 Miu ..................... G05B 19/401 700/257
2015/0134112 A1 * 5/2015 Chen .................... B25J 11/0095 700/254
2020/0144097 A1 * 5/2020 Thaulad ............ H01L 21/68785
2021/0225687 A1 * 7/2021 Malik ............... H01L 21/68742
2021/0378100 A1 * 12/2021 Criminale ............... H01L 22/34
2023/0095452 A1 * 3/2023 Oshima ............. H01L 21/67742 414/217
2024/0025671 A1 * 1/2024 Tan ....................... H01L 21/677

* cited by examiner

*Primary Examiner* — Michael Collins
(74) *Attorney, Agent, or Firm* — Foley & Lardner LLP

(57) ABSTRACT

A device includes a movable blade having a first surface to receive a semiconductor wafer. The device can include a positional sensor to detect a position of the semiconductor wafer on a surface of the movable blade, relative to a stationary body. The movable blade can be configured to move relative to the stationary body to cause a displacement of the semiconductor wafer relative to the movable blade. The positional sensor can be coupled to the movable blade.

14 Claims, 10 Drawing Sheets

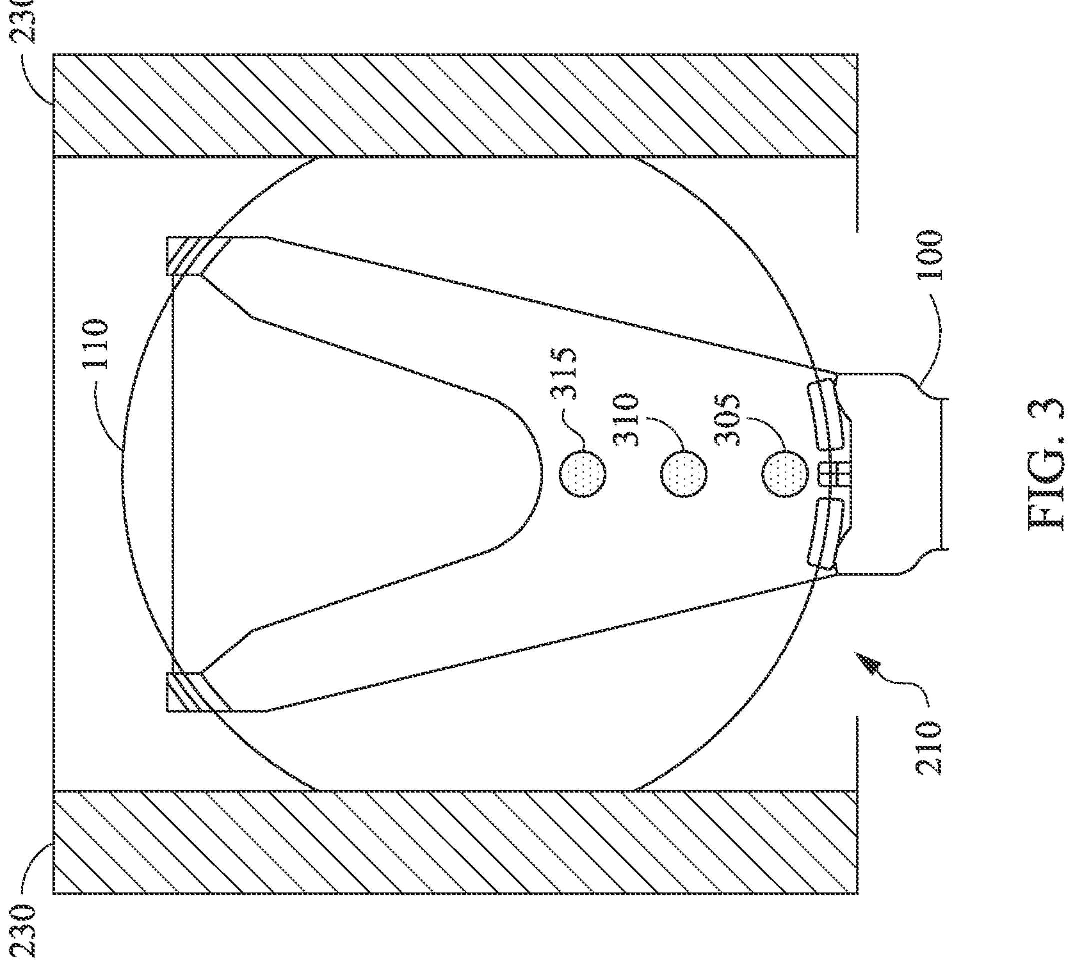
FIG. 3
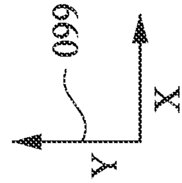

SYSTEMS AND METHODS FOR SEMICONDUCTOR WAFER TRANSPORT

BACKGROUND

Semiconductor manufacturing can include transporting a semiconductor wafer to various chambers or other portions within or between an electric front end machine (EFEM), front opening unified pod (FOUP), or other cassette. Each portion can be associated with a temperature, pressure, or other environmental condition, or an alignment or other position for one or more of the semiconductor wafers. As semiconductor nodes advance, the demand for process control has grown. There has grown a need for improved process control for the manufacture of various semiconductor devices, including the handling and transportation of semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is an example of a top view of a movable blade interfacing with the semiconductor wafer of a cassette, in accordance with some embodiments.

DETAILED DESCRIPTION

Figure 1:
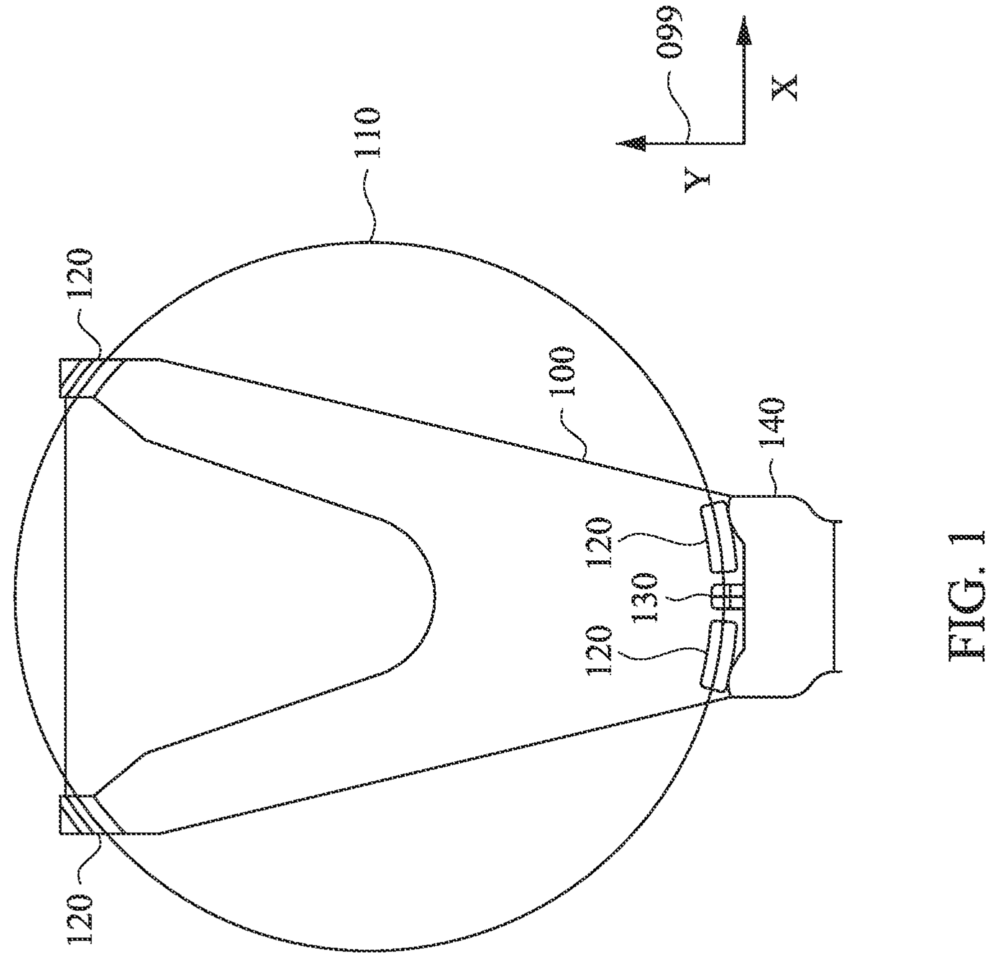
FIG. 1 is an example of a top view of a movable blade for semiconductor wafer transport, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. References to "or" may be construed as inclusive so that any terms described using "or" may indicate any of a single, more than one, and all of the described terms.

An electric front end machine (EFEM; sometimes referred to as an electronic front end module) can integrate one or more process chambers with a port to receive or deliver one or more semiconductor wafers. A cassette such as a front opening unit pod (FOUP) can be included in or coupled to a port of the EFEM. A movable blade can transport semiconductor wafers between and within the chambers of the EFEM or the FOUP. The EFEM can include one or more sensors to detect a condition of a chamber, FOUP, or wafer. For example, the movable blade can include a temperature sensor to detect a temperature of the wafer or chamber, or a positional sensor to detect a position of a wafer with respect to a movable blade or another portion of the EFEM. The temperature sensor can include a contact sensor (e.g., a thermocouple) or a non-contact sensor (e.g., an infrared (IR) sensor) to detect a temperature of a wafer or a chamber. The positional sensor can include an image sensor (e.g., a charge-coupled device (CCD) sensor). The EFEM can include a machine learning model to associate the temperature of a chamber or a position of a wafer with a condition of chips derived from the semiconductor wafer. For example, a yield comprising a number of employable chips having pre-defined performance characteristics can be associated with a condition of a chamber or wafer as detected by the various sensors of the movable blade.

Referring to FIG. 1, depicted is a movable blade 100 (sometimes referred to as an endeffector) for semiconductor wafer 110 transport. The movable blade 100 can include a body of metallic or non-metallic materials, and can include one or more interface components to interface to a semiconductor wafer 110. The interface components can join the movable blade 100 to the semiconductor wafer 110 based on gravity, pressure, or otherwise couple the semiconductor wafer 110 to the movable blade 100 during a movement of the movable blade 100. The interface components can include one or more contact pads such as vacuum cups, vacuum hoses, spacers, edge-grip pads, or the like. Some contact pads can be configured to contact the semiconductor wafer 110 with a fluid (e.g., nitrogen, oxygen, or air) to lift the semiconductor wafer 110 above the movable blade 100. The movable blade can include various embodiments, such as the depicted forked blade, a circular or semicircular blade, or any other blade type.

The movable blade 100 can be coupled (e.g., permanently, engageably, or rotatably) to a blade receiver 140. The blade receiver 140 includes one or more connections (e.g., mechanical, electrical, or thermal) to couple at least one movable blade 100 and any sensors, contact pads, or vacuum lines thereof to the blade receiver 140. The blade receiver 140 can include or interface with one or more linear or rotational actuators to cause movement of the movable blade 100. For example, the blade receiver 140 can include an actuator to cause a movement in the depicted x-y plane, or an actuator to cause a displacement in a perpendicular z direction (with reference to the axis 099). For example, the blade receiver 140 can cause a z-axis 099 displacement of the movable blade 100 to lift or place a semiconductor wafer, and an x or y-axis 099 displacement of the blade to transport the semiconductor wafer 110. The blade receiver 140 can include or interface with one or more vacuum pumps to cause a selective vacuum to be applied to one or more contact pads to selectively couple the semiconductor wafer 110 to the movable blade 100. The sensors, contact pads, or vacuum lines of the blade receiver 140 can provide power for, or communicatively couple various sensors to one or more processors of or associated with the EFEM.

The sensors of the movable blade 100 can include thermal sensors (e.g., contact or non-contact thermal sensors 130) or positional sensors 120 (e.g., image sensors, LIDAR sensors, photodetectors, or magnetic sensors). The thermal sensors can detect a temperature of the movable blade 100, an ambient temperature surrounding the movable blade 100 (e.g., a chamber or portion thereof), or a temperature of the semiconductor wafer 110. The temperature sensors can convey the temperature data to the one or more processors, which can cause the temperature data to be stored. The temperature data can include one or more temperatures, such as a periodic temperature, a temperature exceeding a threshold, an average temperature, or the like. The processor can receive and store further information associated with the temperature data such as a time, a unique identifier for the semiconductor wafer 110, process operations associated with a chamber, a unique identifier of the chamber, or a unique identifier of a cassette (e.g., the FOUP).

The positional sensors 120 can include image sensors, LIDAR sensors, ultrasonic sensors, photodetectors, or magnetic sensors. The positional sensors 120 can detect a position of the semiconductor wafer 110 relative to the movable blade 100 or relative to a stationary body such as chamber wall or placement position, an FOUP slot or boundary, another semiconductor wafer 110, or the like. The positional data can include a distance from the positional sensor 120 to one or more boundaries such as a cassette wall or other feature or a semiconductor wafer 110. The positional sensor 120 can detect a surface type. For example, a magnetic sensor can detect a corresponding magnetic material of the cassette, or a photodetector can detect a reflective surface of the semiconductor wafer 110. The positional sensor 120 or a processor coupled thereto can determine a boundary of the semiconductor wafer 110, such as by detecting an edge of the surface thereof. The positional sensors 120 can convey positional data to the one or more processors for storage, as well as information associated with the positional data, such as the various identification, time, or process information corresponding to the information associated with the temperature data. The positional sensors 120 or the temperature sensors can be disposed in various orientations, quantities, or embodiments. For example, positional sensors 120 can be directional or omnidirectional, the positional sensors 120 can include various sensor types or orientations to determine the position of the movable blade 100 or semiconductor wafer 110 with various environmental objects including further semiconductor wafers 110, cassettes, or EFEMS portions (e.g., chambers).

Figure 2:
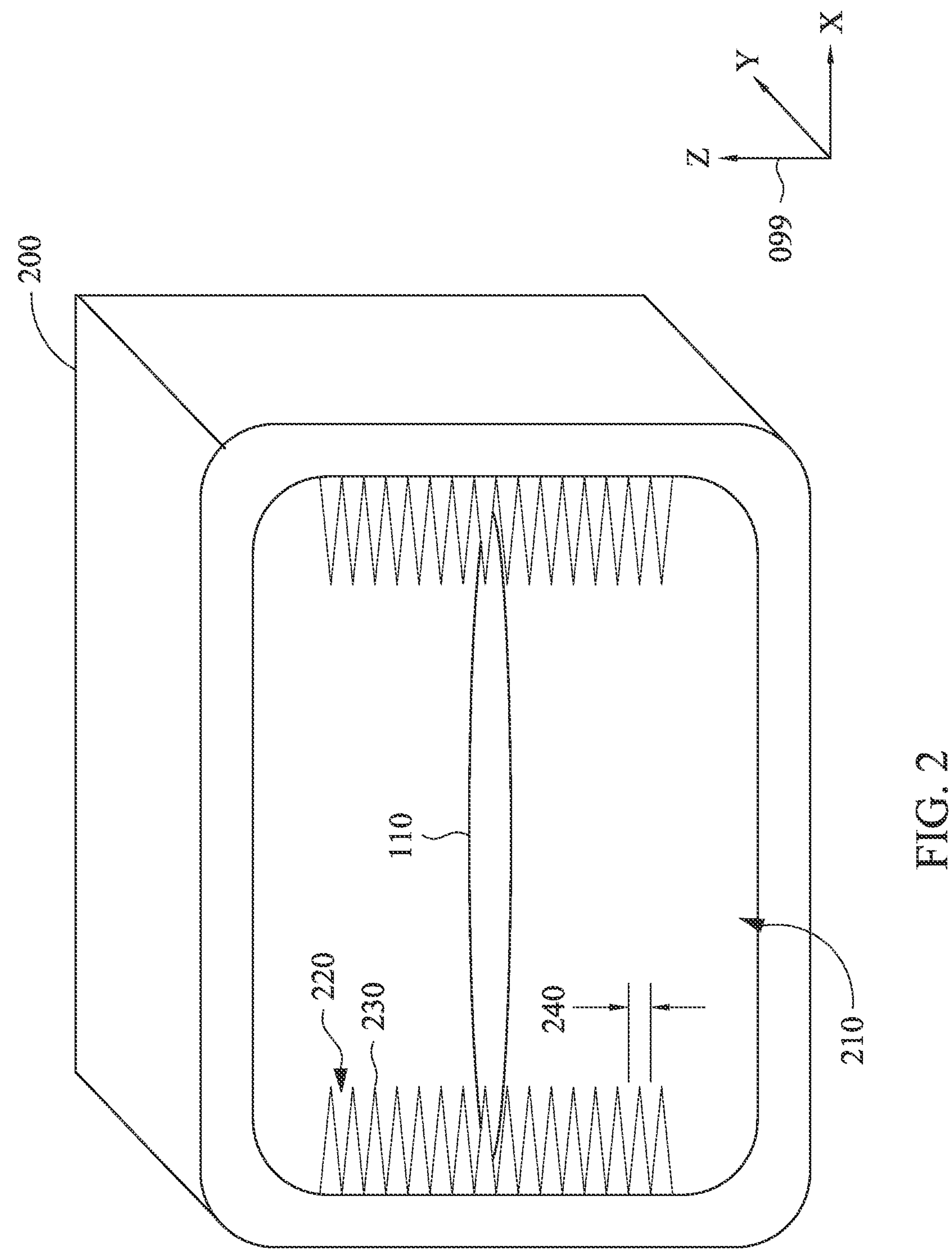
FIG. 2 is an example of a front opening unified pod (FOUP) including a semiconductor wafer, in accordance with some embodiments.

FIG. 2 is an example of a front opening unified pod (FOUP) 200 including a semiconductor wafer 110, in accordance with some embodiments. The FOUP 200 can include an opening 210 which can be selectively closed with a front panel (not depicted). The front panel can maintain an environment (e.g., pressure, temperature, particulate matter) and can be detected by a positional sensor 120. The front panel can be removed by the EFEM prior to a withdrawal or deposit of a semiconductor wafer 110 between the EFEM and the FOUP 200. The movable blade 100 can enter the opening 210 to deposit or withdraw semiconductor wafers 110. The semiconductor wafers 110 can be disposed on one or more slots 220. The slots 220 can be defined by one or more protrusions 230 of the carrier body of the FOUP 200. An inter-slot distance 240 can exceed a thickness of a semiconductor wafer 110, such as by a vertical dimension of the movable blade 100 such that a movable blade 100 can remove a semiconductor wafer 110 from a protrusion 230 of the FOUP 200 by a vertical displacement thereof. For example, an FOUP 200 can include protrusions 230 having a vertical spacing of 10 mm, 20 mm, etc. A semiconductor wafer 110 can be displaced from a slot 220 of the FOUP 200 along a vertical or lateral dimension (e.g., along the x or y axis 099). The FOUP 200 can be displaced relative to the EFEM. For example, a load port of the EFEM may include a range of distances, skews, or the like to couple the EFEM to the FOUP 200. Thus, the movable blade 100 can be misaligned with respect to the semiconductor wafer 110 in an FOUP 200. Similar misalignment can occur with regard to depositing, withdrawing, or otherwise manipulating (e.g., flipping) the semiconductor wafer 110 in a chamber of an EFEM (e.g., a process chamber, load port, or interstitial portion).

FIG. 3 is an example of a top view of a movable blade 100 interfacing with the semiconductor wafer 110 of a cassette, in accordance with some embodiments. For example, the cassette can be the FOUP 200 of FIG. 2. Depicted are a leftmost and rightmost protrusion 230 to receive the semiconductor wafer 110. Various additional protrusions 230 or semiconductor wafers 110 can be disposed above, or below the depicted protrusions 230 or semiconductor wafers 110. The spacing and shape of the protrusions 230 can vary according to a cassette design. For example, the protrusions 230 can be perpendicular to the front opening 210 of the cassette as depicted, or can conform to the radius of the semiconductor wafer 110.

Various temperature sensors are disposed along the movable blade 100. Temperature or other sensors can be disposed at any point of the movable blade 100. For example, three temperature sensors can be disposed to detect a temperature of at least three subdivisions of the semiconductor wafer 110. Some embodiments can employ additional or fewer sensors. The temperature sensors can be or include an IR sensor including an image sensor, or a thermocouple. A first temperature sensor 305 can be employed to detect a temperature of a first subdivision of the semiconductor wafer 110 (e.g., an outer concentric portion). A second temperature sensor 310 can be employed to detect a temperature of another subdivision of the semiconductor wafer 110 (e.g., an central concentric portion). A third temperature sensor 315 can be employed to detect a temperature of another subdivision of the semiconductor wafer 110 (e.g., an inner concentric portion). Further temperature sensors or other sensors can be disposed on the movable blade 100 (e.g., the depicted movable blade 100 or other movable blades 100 having various geometries, as may be employed in each of the various embodiments of the present disclosure).

The subdivisions of the semiconductor wafer 110 can be discrete, overlapping, concentric, radial, etc. Various temperature or other sensors can be combined with sensors which are not coupled to the movable blade 100. For example, a charge-coupled device (CCD) (e.g., IR, visible spectrum, or other image sensors) can be disposed on the movable blade 100 or otherwise employed to gather data associated with the semiconductor wafer 110. The sensors can determine a temperature, position, or other condition of the semiconductor wafer 110.

Figure 4:
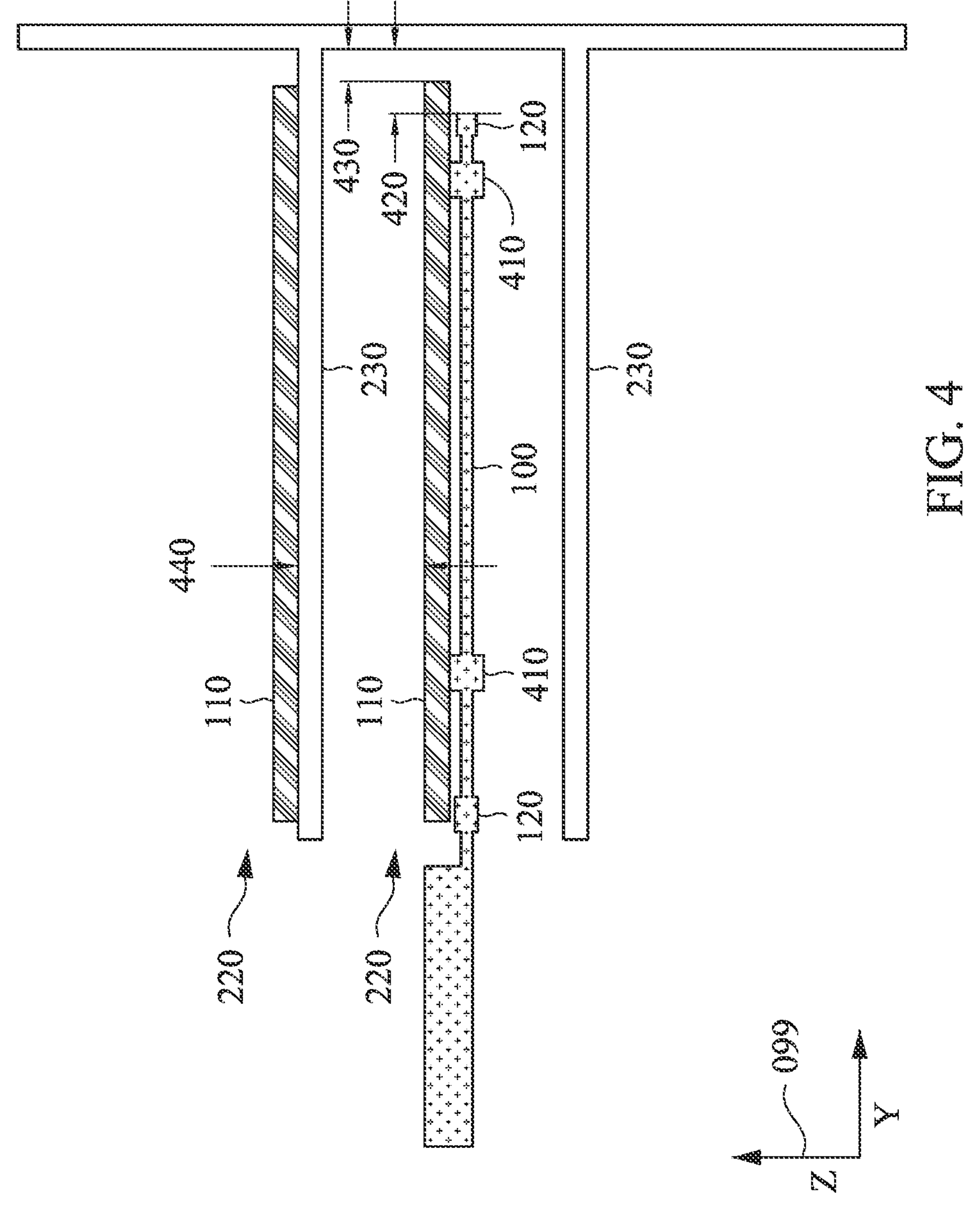
FIG. 4 is an example of a cross sectional view of a movable blade interfacing with a semiconductor wafer in a cassette, in accordance with some embodiments.

FIG. 4 is an example of a cross sectional view of a movable blade 100 interfacing with a semiconductor wafer 110 in a cassette, in accordance with some embodiments. The semiconductor wafer 110 can interface with the movable blade 100, such as by one or more contact pads 410. The contact pad 410 can couple to the movable blade 100 based on gravity, electrostatic forces, or by a vacuum such as a vacuum cup or line. For example, the semiconductor wafer 110 can couple to an upper or lower surface of the movable blade 100. The movable blade 100 can include one or more positional sensors 120. For example, a positional sensor 120 can detect a first distance 420 between the movable blade 100 and a boundary of the cassette. A positional sensor 120 can detect a second distance 430 between the semiconductor wafer 110 and a boundary of the cassette. For example, the second distance 430 can be inferred based on the first distance 420 (e.g., the positional sensor 120 can detect a distance between a portion of the movable blade 100 and an edge of the semiconductor wafer 110). A positional sensor 120 can detect a position between various semiconductor wafers 110 (e.g., to determine one or more occupied or available slots 220 or to avoid an impact between semiconductor wafers 110).

The positional sensors 120 can determine a distance in one or more directions and can be duplicated, omitted, or substituted according to a location, use, or other employment. For example, each distance can be detected by one or more positional sensors 120; each positional sensor 120 can detect one or more distances. Positional sensors 120 can be disposed one or more sides of the movable blade 100. For example, the movable blade 100 can be configured to couple with a semiconductor wafer 110 along one or more surfaces, and the positional sensors 120 can detect a position of semiconductor wafers 110 or other environmental objects in a same, opposite, or perpendicular direction. One or more positional sensors 120 can detect further attributes of the semiconductor wafer 110 or EFEM. For example, the positional sensor 120 can include an IR CCD to detect a position, temperature, or rotation, speed, or other attribute of one or more semiconductor wafers 110.

The positional sensors 120 can include a positional sensor 120 to detect a portion of an FOUP 200, or a gap between an upper and lower semiconductor wafer 110 (e.g., semiconductor wafers 110 disposed in vertically spaced slots 220). For example, first positional sensors 120 can be disposed at a terminal end (e.g. tine) of the movable blade 100, to detect a position of an edge of the semiconductor wafer 110, an edge of a cassette or chamber the wafer is disposed in, or a vertical distance between adjacent semiconductor wafers 110 (e.g., in vertically spaced slots 220 of the FOUP 200). A further first positional sensor 120 can be disposed on an opposite end from the other of the first positional sensors 120. In some embodiments, second positional sensors 120 can be located proximal to the first positional sensors 120 to detect an inter-wafer gap (e.g., in addition or instead of such a detection by the first positional sensors 120). For example, the first positional sensors 120 can detect objects along the x or y axis 099, and the second positional sensors 120 can detect objects along the z axis 099. Third positional sensors 120 can be disposed on perpendicular terminals of the movable blade 100. For example, the third positional sensors 120 can be disposed on perpendicular extremes of an opposite end of the movable blade 100 from the first positional sensors 120. According to some embodiments, the second positional sensors 120 can detect a left or right side of the FOUP 200.

A processor communicatively coupled to one or more positional sensors 120 can be employed to perform an inference. A positional sensor 120 can detect a distance 440 between the semiconductor wafer 110 and another semiconductor wafer 110. The processor can cause the movable blade 100 to be relocated or the operation of the movable blade 100 to otherwise be altered. For example, the position of the movable blade 100 can be adjusted based on the alignment of the movable blade 100 with the semiconductor wafer 110. The processor can infer the position of either of the movable blade 100 or the semiconductor wafer 110 from one or more measurements, including a measurement of a boundary such as a sidewall, protrusion 230, or other portion of a FOUP 200 or one or more wafers.

Figure 5:
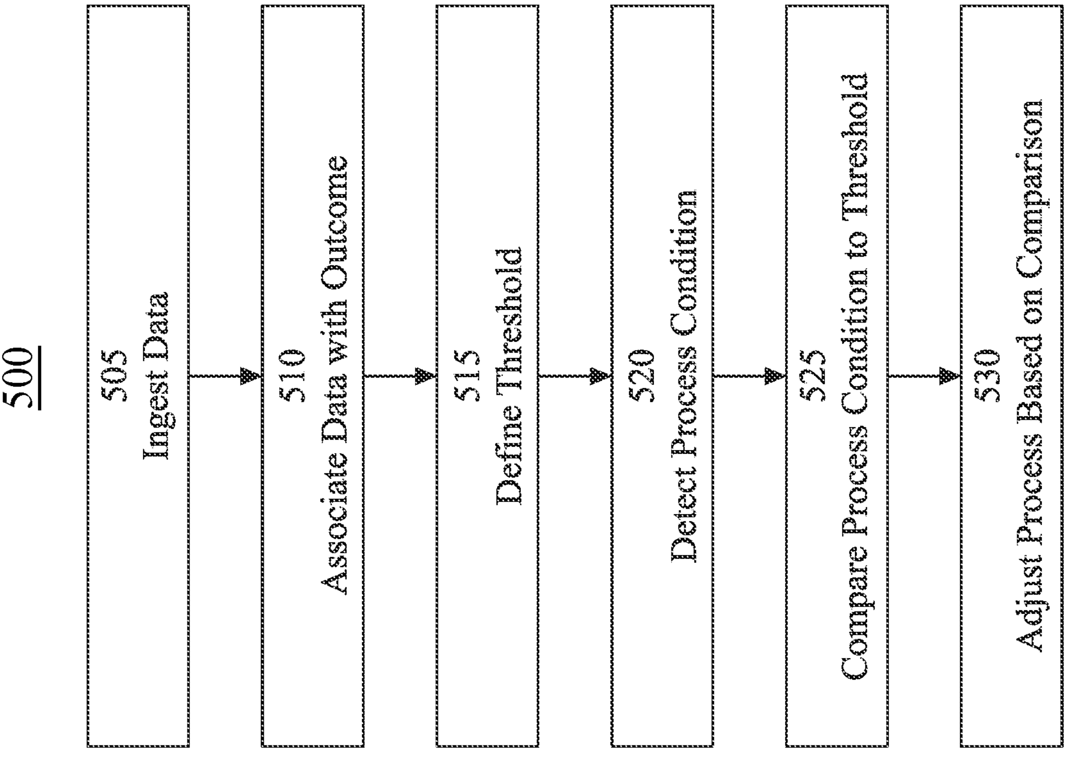
FIG. 5 illustrates a flow chart of an example for adjusting a process based on received data, in accordance with some embodiments.

FIG. 5 illustrates a flow chart of an example method 500 for adjusting a process based on received data, in accordance with some embodiments. For example, at least some of the operations of the method 500 can be used to transport a semiconductor wafer 110 or improve a yield thereof. It is noted that the method 500 is merely an example, and is not intended to limit the present disclosure. Accordingly, it is understood that additional operations may be provided before, during, and after the method 500 of FIG. 5, and that some other operations may only be briefly described herein.

In brief summary, the method 500 starts with operation 505 of ingesting data. The method 500 continues to operation 510 of associating an outcome with the ingested data. The method 500 continues to operation 515, at which a threshold is defined. At operation 520 of the method 500, a process condition is detected. At operation 525 of the method 500, the process condition is compared to the threshold. The method 500 continues to operation 530, at which a process is adjusted based on the comparison of operation 525.

At operation 505, data is ingested by a machine learning model. For example, the data can comprise temperature data associated with one or more chambers or semiconductor wafers 110. The data can comprise one or more positions of a wafer. For example, the data can include image data or numeric data collected by sensors coupled to the movable blade 100. The data can include data associated with a yield of a chip/die from one or more semiconductor wafers 110. For example, the yield data can include a performance or result of a test of the die, or a package comprising the die. The yield data can include the portion of dies associated with a semiconductor wafer 110 which exceed a threshold for use. The yield data can include performance data such as a performance metric or attribute associated with a circuit of a semiconductor wafer 110, such as a maximum frequency of a ring oscillator or other test circuit, alignment data, warranty return rate, a memory access time, resistivity of a connection, functionality or non-functionality of a circuit, or the like. The machine learning model can ingest the yield data.

At operation 510, the sensor data is associated with the yield data. For example, an explainable AI model can associate a temperature of one or more processes of the EFEM (e.g., aluminum deposition) with the yield data. The explainable AI model can associate a number of process variables with a process outcome, such that a known outcome (e.g., percent yield) can be explained by a weighting assigned to each process variable. For example, the explainable AI model can assign a temperature of a first process with a weight of 0.2, a temperature of a second process which is more predictive of the percent yield than the first process with a weight of 0.7, and a weight of a position determined by the positional sensor 120 with a weight of 0.5. A predictive machine learning model can predict a performance of a die or a package comprising the die based on the ingested data. For example, the machine learning model can predict a performance of a semiconductor wafer 110 or a subdivision thereof, or a portion of high performance chips or low performance chips. The chips can thereafter be tested, selected, placed, or combined based on predicted yield data. Various machine learning models can be associated with various sensor data. For example, a convolutional neural net can predict yield data based on images (e.g., images captured by one or more CCD sensors).

At operation 515, a threshold is defined based on the association of the data with the yield data. For example, the threshold can be a temperature threshold associated with a chamber, a semiconductor wafer 110, or a subdivision thereof. For example, each radial or concentric subdivision can have different predicted yield data associated therewith. An attribute of a subdivision can be associated with predicted yield data for the semiconductor wafer 110 or the subdivision. For example, an outermost concentric subdivision of a semiconductor wafer 110 having a temperature in excess of 200° C. following a process (e.g., a deposition of aluminum pads) can be associated with a performance or yield of the wafer, the outermost concentric subdivision of the wafer, or another subdivision of the wafer (e.g., an innermost concentric subdivision). Similarly, a positional sensor 120 can be associated with yield data based on the position with respect to a chamber, an alignment mark, or another semiconductor wafer 110. The threshold can be numeric or non-numeric. For example, the thresholds can be a similarity range with respect to one or more reference images (e.g., a golden image), or can be the image.

At operation 520, a process condition is detected. For example, the process condition can be detected at a single detection point. Single point detections include average, maximum, or minimum temperatures, temperature changes, a temperature at a defined point in the process, maximum positional deviations of a subdivision (e.g., an alignment marker, edge, die, axis, or center). For example, a chamber can be associated with a position limit (e.g., plus or minus about 1 mm or about 0.1 mm), or a temperature limit (e.g., between 10° C. and 450° C.). Multiple point detections can include combinations of single detection points. For example, a process condition can combine a position or temperature of one or more portions of a semiconductor wafer 110 (e.g., a radial skew and x-direction offset).

At operation 525, the process condition is compared to a threshold. The comparison can include determining whether the condition exceeds the threshold or is within the range. The comparison can include determining a similarity or prediction based on the condition. For example, the comparison can compare a predicted yield to a target yield. The comparison can include comparing an image captured by an image sensor to a reference image, comparing a numeric value, or the like.

At operation 530, the process is adjusted based the comparison of the process to the threshold. For example, the process can be adjusted to reduce a positional offset of the movable blade 100 with respect to the semiconductor wafer 110, increasing or decreasing a temperature of a chamber, increasing or decreasing a dwell time, cycle count, cycle length, or the like. According to some embodiments, the adjusted process can be compared to the threshold. The comparison can be across one or more semiconductor wafers 110. For example, a single semiconductor wafer 110 can have various iterations of temperature or positional adjustments, or various process adjustments can be applied to successive wafers. For example, an anneal time can be adjusted between successive semiconductor wafers 110. The yield data associated with each of the successive semiconductor wafers 110 can be ingested into the machine learning model such that each successive wafer can train the machine learning model.

Figure 6:
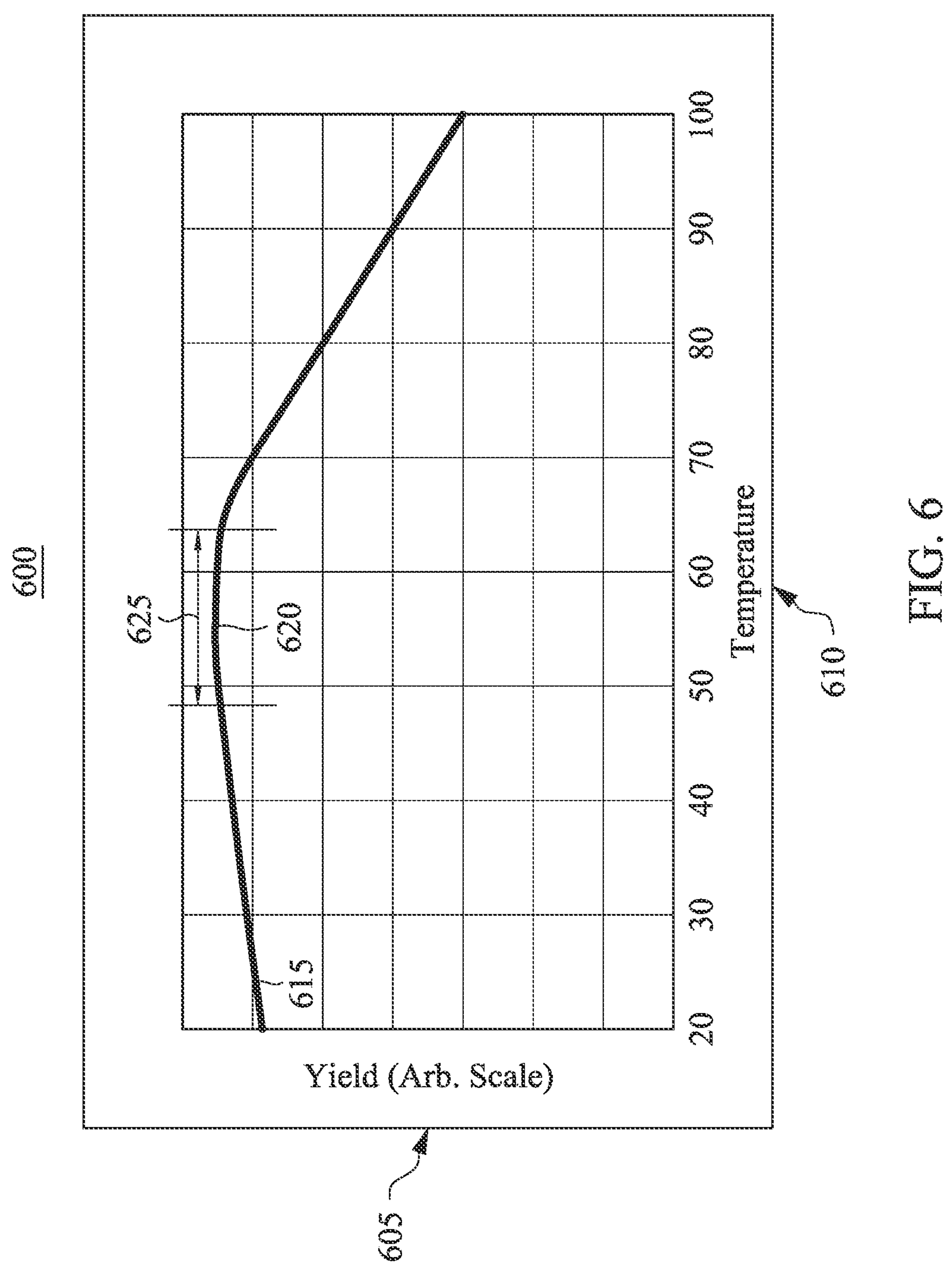
FIG. 6 is an example of a yield to temperature diagram, in accordance with some embodiments.

FIG. 6 is an example of an associational data map 600 between a yield 605 and a relevant temperature 610, in accordance with some embodiments. The yield 605 is depicted as an arbitrary scale which can be or include a number of operable dies harvested from a semiconductor wafer 110. The yield 605 can be or include a performance (e.g., median, minimum, or maximum) of all or a portion of the operable dies harvested from the wafer. The yield 605 can be or include a metric comprising various performance attributes or numbers of operable dies. Although the associational data 615 is presented with an arbitrary scale, various scales can be employed for various metrics (e.g., percent, Mhz, watts, etc.). The relevant temperature 610 can include a temperature of a chamber associated with a semiconductor wafer 110, or a temperature of the semiconductor wafer 110 or a subdivision thereof. For example, an associational data map 600 can be constructed on a per chamber basis, a per-semiconductor wafer 110 basis, or a per-die basis.

The associational data 615 can be received from various sensors of an EFEM including sensors disposed on one or more movable blades 100. The associational data 615 can be plotted between various attributes. For example, the associational data 615 can be gathered for various sensors to determine a correlation with a yield 605. Corresponding sensor data can include a temperature of a wafer during one or more processes (e.g., of an anneal oven, a deposition process, a degassing chamber, or an ambient temperature of an environment internal or external to a chamber). The relevant temperature 610 can be one or more of the temperatures determined to have a relevance to the yield (e.g., by an explainable AI model, or predictive AI model). Various associational data 615 can be associated with one or more attributes. For example, a position of the semiconductor wafer 110 (e.g., magnitude or degree of offset with respect to an alignment mark or other reference) can be associated with yield data. Such data can be numeric as in the case of the relevant temperature 610, or otherwise encoded. For example, one or more CCD can generate an image of a semiconductor wafer 110; the image can be associated with a yield 605. For example, a prediction of a yield 605 of a semiconductor wafer 110 or a portion thereof can be determined based on the image.

One or more ranges 625 of the associational data 615 can be defined according to a yield 605 associated therewith. For example, the range 625 can include a temperature range, a positional range, or a range 625 of another attribute. The range 625 can be centered around or otherwise include one or more local zeros 620 of the yield 605 (e.g., a maximum or local maximum). The range 625 can be demarcated by one or more thresholds. The thresholds can be provided to an EFEM to adjust an operation thereof. For example, the EFEM can adjust an alignment of the movable blade 100 with respect to a semiconductor wafer 110, a temperature (e.g., of a process chamber), a time or cycle count of a process, or the like.

Figure 7:
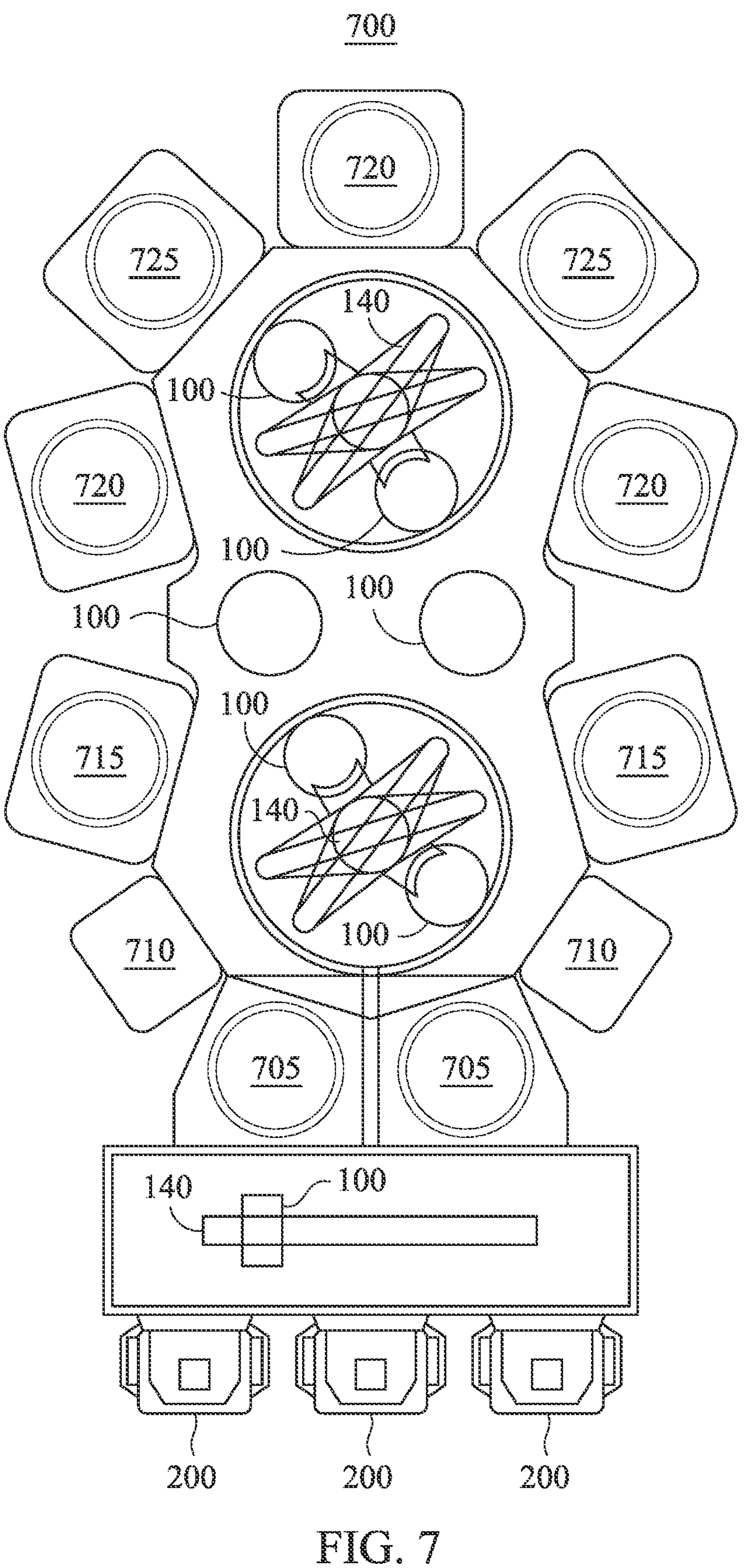
FIG. 7 is an example of an electric front end machine (EFEM), in accordance with some embodiments.

FIG. 7 is an example of an electric front end machine (EFEM) 700, in accordance with some embodiments. The EFEM 700 can receive semiconductor wafers 110 via one or more cassettes such as FOUPs 200 at a load port. A movable blade 100 can transport the semiconductor wafers 110 between (e.g., to and from) the FOUPs 200 and other EFEM portions. For example, a blade receiver 140 can transport the movable blade 100, and the movable blade 100 can further extend to transport the semiconductor wafers 110. Various movable blades 100 coupled to blade receivers 140 can transport the semiconductor wafers 110 between various chambers including LLC chambers 705, and various process chambers such as a de-gasification chamber 710, a remote plasma clean chamber 715, an aluminum deposition chamber 720, tantalum deposition chamber 725, copper or gold deposition chamber, dielectric deposition chamber or other chambers. The various chambers can be contiguous portions of the EFEM 700 or disposed separately, such as an anneal oven. One or more interstitial locations for semiconductor wafers 110 can be disposed throughout the EFEM 700.

Figure 8:
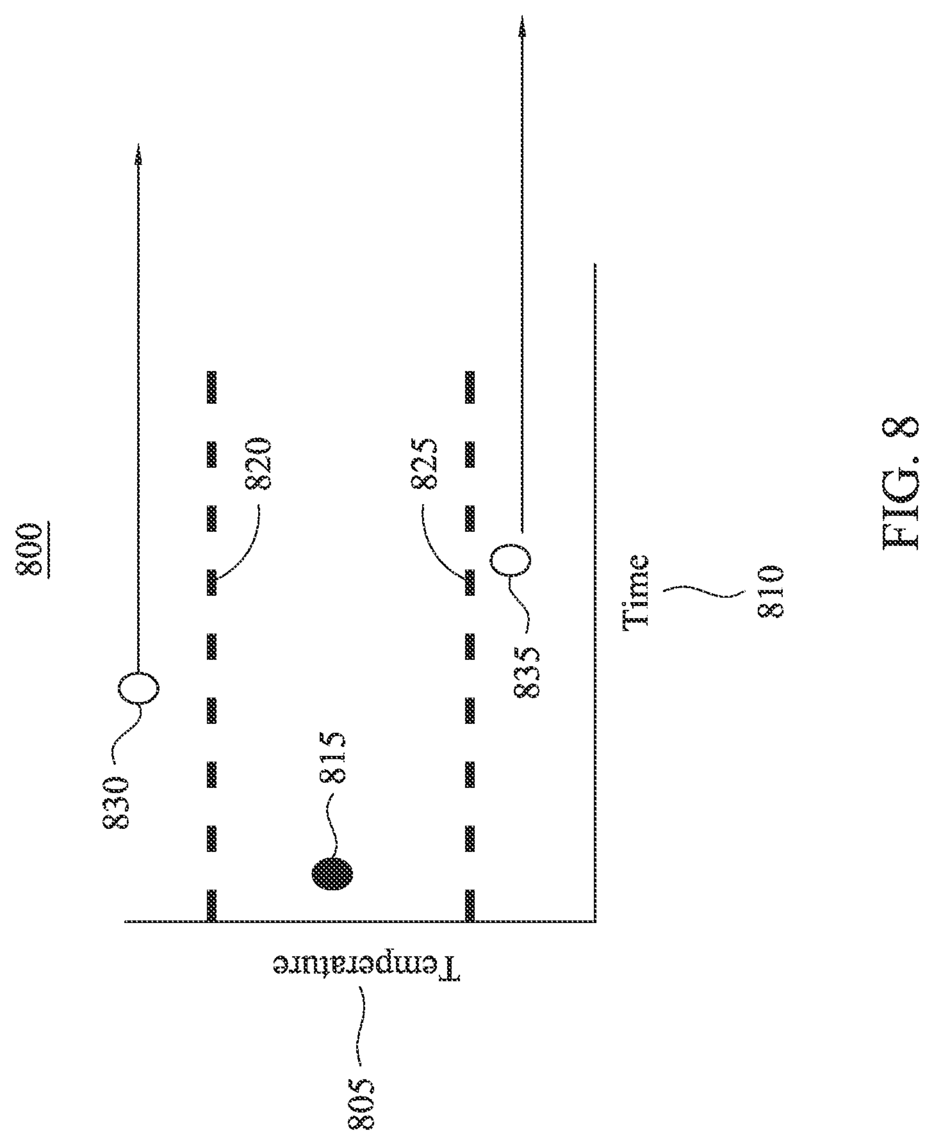
FIG. 8 is temperature chart 800 for a chamber of an EFEM, in accordance with some embodiments.

FIG. 8 illustrates a temperature chart 800 for a chamber of an EFEM 700, in accordance with some embodiments. The temperature chart 800 depicts a temperature 805 longitudinally over time 810. In some embodiments, the temperature 805 can be depicted over a cycle count, or other process description. In some embodiments, the temperature 805 can be supplemented or replaced with a position or other attribute. A target temperature 815 is provided. The target temperature 815 can be fixed over time (or another longitudinal process description), or can vary over time. For example, the target temperature 815 can be a target temperature profile which is variable longitudinally. The chamber of the EFEM 700 can be adjusted to converge the temperature towards the target temperature 815. An upper threshold 820 or lower threshold 825 can be defined. A process can be paused in response to a temperature exceeding one of the thresholds. For example, at a first time 830, the temperature can exceed the temperature limit whereupon the process can dwell to allow the temperature to drop below the upper threshold 820. At a second time 835, the temperature 805 can fall beneath a low temperature threshold 825 whereupon the process can dwell to increase the temperature 805. The upper temperature threshold 820 or lower temperature threshold 825 can vary longitudinally, such as to track to a temperature profile.

Although the depicted temperature chart 800 compares temperature, and includes temperature thresholds, various threshold can be defined for positional metrics, or a similarity of an image with respect to a target image (which may be referred to as a "golden image").

Figure 9:
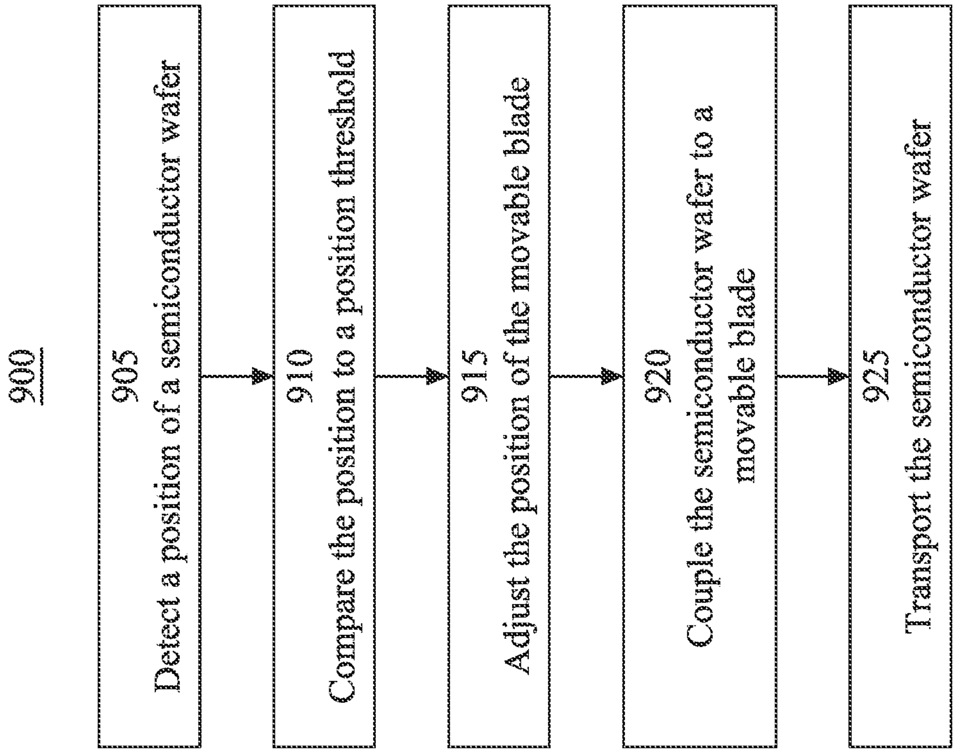
FIG. 9 illustrates a flow chart of an example for transporting a semiconductor wafer, in accordance with some embodiments.

FIG. 9 illustrates a flow chart of an example method 900 for transporting a semiconductor wafer 110, in accordance with some embodiments. It is noted that the method 900 is merely an example, and is not intended to limit the present disclosure. Accordingly, it is understood that additional operations may be provided before, during, and after the method 900 of FIG. 9, and that some other operations may only be briefly described herein.

At operation 905, a position of a semiconductor wafer 110 is detected. At operation 910, the position is compared to a position threshold. At operation 915, the position of the movable blade 100 is adjusted. At operation 920, the semiconductor wafer 110 is coupled to a movable blade 100. At operation 925, the semiconductor wafer 110 is transported by the movable blade 100.

At operation 905, a position of a semiconductor wafer 110 is detected. The position is detected by a positional sensor 120 coupled to a movable blade 100. The position can be detected with respect to one or more portions of an FOUP 200, another semiconductor wafer 110, a process chamber of an EFEM 700, or the movable blade 100. For example, an alignment portion (e.g., edge, mark, or other feature) of the semiconductor wafer 110 can be detected by the positional sensors 120. At operation 910, the position is compared to a position threshold. The position threshold can be determined based on a predicted or past yield 605 of a same or related semiconductor wafer 110. For example, a threshold based on yield data can be defined as a maximum offset of 0.1 mm in a first direction and 1 mm in a second direction.

At operation 915, the position of the movable blade 100 is adjusted. For example, the position of the movable blade 100 can be adjusted responsive to a target or an exceeded threshold. For example, if a position of the semiconductor wafer 110 is offset 2 mm and an offset of 1 mm is defined as a threshold, the semiconductor wafer 110 can be adjusted to reduce or eliminate an offset. An adjustment can be iterative. For example, a further detection can validate or determine a further adjustment. At operation 920, the semiconductor wafer 110 is coupled to a movable blade 100. The coupling can be by an actuation of a vacuum line, or the displacement of the movable blade 100. For example, an upward movement of the movable blade 100 can mechanically or electrostatically couple the semiconductor wafer 110 to the movable blade 100. In some embodiments, operations 905, 910, or 915 can be performed (e.g., repeated) subsequent to the coupling of the semiconductor wafer 110 to the movable blade 100. Indeed, the various methods herein can be performed in various orders, and operations can be omitted, substituted, repeated, or the like. Such operations can detect or reduce an offset of the semiconductor wafer 110 incident to its coupling. At operation 925, the semiconductor wafer 110 is transported by the movable blade 100. For example, the semiconductor wafer 110 can be placed into a process chamber of the EFEM 700.

Figure 10:
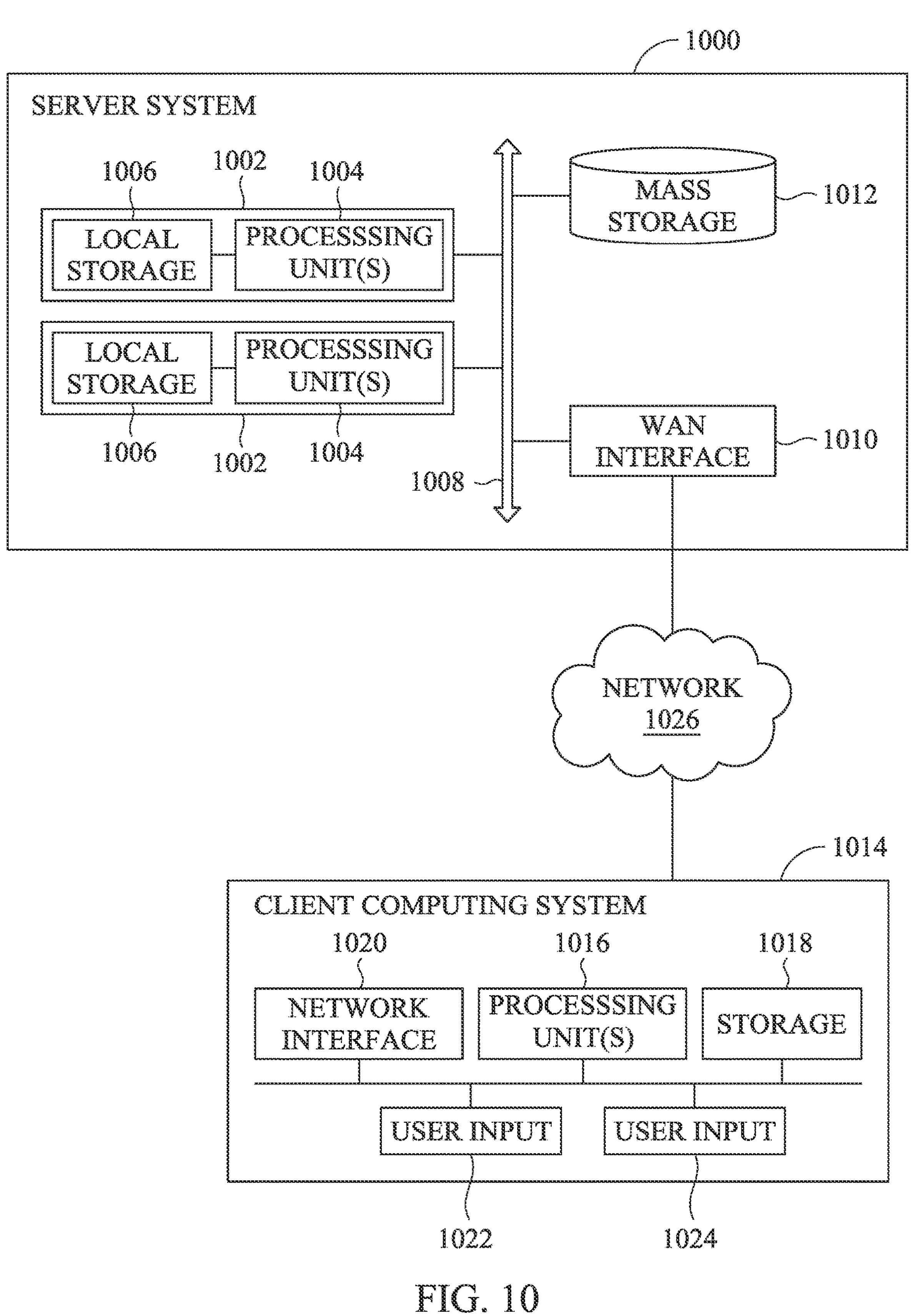
FIG. 10 illustrates a block diagram of an example computer system, in accordance with some embodiments.

Various operations described herein can be implemented on computer systems. FIG. 10 shows a simplified block diagram of a representative server system 1000, client computing system 1014, and network 1026 usable to implement certain embodiments of the present disclosure. In various embodiments, server system 1000 or similar systems can implement services or servers described herein or portions thereof. Client computing system 1014 or similar systems can implement clients described herein. The systems and methods described herein can be similar to the server system 1000. Server system 1000 can have a modular design that incorporates a number of modules 1002 (e.g., blades in a blade server embodiment); while two modules 1002 are shown, any number can be provided. Each module 1002 can include processing unit(s) 1004 and local storage 1006. For example, a client computing system 1014 can be part of or proximal to the EFEM 700 and be in network communication with one or more remote server systems 1000. The client computing system 1014 or remote server system 1000 can implement various portions of the provided disclosure.

Processing unit(s) 1004 can include a single processor, which can have one or more cores, or multiple processors. In some embodiments, processing unit(s) 1004 can include a general-purpose primary processor as well as one or more special-purpose co-processors such as graphics processors, digital signal processors, tensor cores, or the like. In some embodiments, some or all processing units 1004 can be implemented using customized circuits, such as application specific integrated circuits (ASICs) or field programmable gate arrays (FPGAs). In some embodiments, such integrated circuits execute instructions that are stored on the circuit itself. In other embodiments, processing unit(s) 1004 can execute instructions stored in local storage 1006. Any type of processors in any combination can be included in processing unit(s) 1004.

Local storage 1006 can include volatile storage media (e.g., DRAM, SRAM, SDRAM, or the like) and/or non-volatile storage media (e.g., magnetic or optical disk, flash memory, or the like). Storage media incorporated in local storage 1006 can be fixed, removable or upgradeable as desired. Local storage 1006 can be physically or logically divided into various subunits such as a system memory, a read-only memory (ROM), and a permanent storage device. The system memory can be a read-and-write memory device or a volatile read-and-write memory, such as dynamic random-access memory. The system memory can store some or all of the instructions and data that processing unit(s) 1004 need at runtime. The ROM can store static data and instructions that are needed by processing unit(s) 1004. The permanent storage device can be a non-volatile read-and-write memory device that can store instructions and data even when module 1002 is powered down. The term "storage medium" as used herein includes any medium in which data can be stored indefinitely (subject to overwriting, electrical disturbance, power loss, or the like) and does not include carrier waves and transitory electronic signals propagating wirelessly or over wired connections.

In some embodiments, local storage 1006 can store one or more software programs to be executed by processing unit(s) 1004, such as an operating system and/or programs implementing various server functions such as functions of the systems and devices depicted herein, or any other server(s) associated with system or any other system described herein.

"Software" refers generally to sequences of instructions that, when executed by processing unit(s) 1004 cause server system 1000 (or portions thereof) to perform various operations, thus defining one or more specific machine embodiments that execute and perform the operations of the software programs. The instructions can be stored as firmware residing in read-only memory and/or program code stored in non-volatile storage media that can be read into volatile working memory for execution by processing unit(s) 1004. Software can be implemented as a single program or a collection of separate programs or program modules that interact as desired. From local storage 1006 (or non-local storage described below), processing unit(s) 1004 can retrieve program instructions to execute and data to process in order to execute various operations described above.

In some server systems 1000, multiple modules 1002 can be interconnected via a bus or other interconnect 1008, forming a local area network that supports communication between modules 1002 and other components of server system 1000. Interconnect 1008 can be implemented using various technologies including server racks, hubs, routers, etc.

A wide area network (WAN) interface 1010 can provide data communication capability between the local area network (interconnect 1008) and the network 1026, such as the Internet. Technologies can be used, including wired (e.g., Ethernet, IEEE 802.3 standards) and/or wireless technologies (e.g., Wi-Fi, IEEE 802.11 standards).

In some embodiments, local storage 1006 is intended to provide working memory for processing unit(s) 1004, providing fast access to programs and/or data to be processed while reducing traffic on interconnect 1008. Storage for larger quantities of data can be provided on the local area network by one or more mass storage subsystems 1012 that can be connected to interconnect 1008. Mass storage subsystem 1012 can be based on magnetic, optical, semiconductor, or other data storage media. Direct attached storage, storage area networks, network-attached storage, and the like can be used. Any data stores or other collections of data described herein as being produced, consumed, or maintained by a service or server can be stored in mass storage subsystem 1012. In some embodiments, additional data storage resources may be accessible via WAN interface 1010 (potentially with increased latency).

Server system 1000 can operate in response to requests received via WAN interface 1010. For example, one of modules 1002 can implement a supervisory function and assign discrete tasks to other modules 1002 in response to received requests. Work allocation techniques can be used. As requests are processed, results can be returned to the requester via WAN interface 1010. Such operation can generally be automated. Further, in some embodiments, WAN interface 1010 can connect multiple server systems 1000 to each other, providing scalable systems capable of managing high volumes of activity. Other techniques for managing server systems and server farms (collections of server systems that cooperate) can be used, including dynamic resource allocation and reallocation.

Server system 1000 can interact with various user-owned or user-operated devices via a wide-area network such as the Internet. An example of a user-operated device is shown in FIG. 10 as client computing system 1014. Client computing system 1014 can be implemented, for example, as a consumer device such as a smartphone, other mobile phone, tablet computer, wearable computing device (e.g., smart watch, eyeglasses), desktop computer, laptop computer, and so on.

For example, client computing system 1014 can communicate via WAN interface 1010. Client computing system 1014 can include computer components such as processing unit(s) 1016, storage device 1018, network interface 1020, user input device 1022, and user output device 1024. Client computing system 1014 can be a computing device implemented in a variety of form factors, such as a desktop computer, laptop computer, tablet computer, smartphone, other mobile computing device, wearable computing device, or the like.

Processing unit(s) 1016 and storage device 1018 can be similar to processing unit(s) 1004 and local storage 1006 described above. Suitable devices can be selected based on the demands to be placed on client computing system 1014; for example, client computing system 1014 can be implemented as a "thin" client with limited processing capability or as a high-powered computing device. Client computing system 1014 can be provisioned with program code executable by processing unit(s) 1016 to enable various interactions with server system 1000.

Network interface 1020 can provide a connection to the network 1026, such as a wide area network (e.g., the Internet) to which WAN interface 1010 of server system 1000 is also connected. In various embodiments, network interface 1020 can include a wired interface (e.g., Ethernet) and/or a wireless interface implementing various RF data communication standards such as Wi-Fi, Bluetooth, or cellular data network standards (e.g., 3G, 4G, LTE, etc.).

User input device 1022 can include any device (or devices) via which a user can provide signals to client computing system 1014; client computing system 1014 can interpret the signals as indicative of particular user requests or information. In various embodiments, user input device 1022 can include any or all of a keyboard, touch pad, touch screen, mouse or other pointing device, scroll wheel, click wheel, dial, button, switch, keypad, microphone, and so on.

User output device 1024 can include any device via which client computing system 1014 can provide information to a user. For example, user output device 1024 can include a display to display images generated by or delivered to client computing system 1014. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). Some embodiments can include a device such as a touchscreen that functions as both input and output device. In some embodiments, other user output devices 1024 can be provided in addition to or instead of a display. Examples include indicator lights, speakers, tactile "display" devices, printers, and so on.

Some embodiments include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operations indicated in the program instructions. Examples of program instructions or computer code include machine code, such as is produced by a compiler, and files including higher-level code that are executed by a computer, an electronic component, or a microprocessor using an interpreter. Through suitable programming, processing unit(s) 1004 and 1016 can provide various functionality for server system 1000 and client computing system 1014, including any of the functionality described herein as being performed by a server or client, or other functionality.

It will be appreciated that server system 1000 and client computing system 1014 are illustrative and that variations and modifications are possible. Computer systems used in connection with embodiments of the present disclosure can have other capabilities not specifically described here. Further, while server system 1000 and client computing system 1014 are described with reference to particular blocks, it is to be understood that these blocks are defined for convenience of description and are not intended to imply a particular physical arrangement of component parts. For instance, different blocks can be but need not be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present disclosure can be realized in a variety of apparatus including electronic devices implemented using any combination of circuitry and software.

In one aspect of the present disclosure, a device is disclosed. The device can include a movable blade configured to receive a semiconductor wafer. The device can include a positional sensor configured to detect a position of the semiconductor wafer on a surface of the movable blade. The position can be relative to a stationary body. The movable blade can be configured to move relative to the stationary body to cause a displacement of the semiconductor wafer relative to the movable blade. The positional sensor can be physically coupled to the movable blade.

In another aspect of the present disclosure, an electric front end machine (EFEM) is disclosed. The EFEM can include a process chamber. The EFEM can include a movable blade coupled to the a movable blade coupled to a blade receiver. A first surface of a movable blade can be configured to receive a semiconductor wafer. The EFEM can include a sensor to detect a position of the semiconductor wafer on a surface of the movable blade, relative to a stationary body. The EFEM can be configured to adjust a position of the movable blade, responsive to the detected position of the sensor. The positional sensor can be coupled to the movable blade.

In yet another aspect of the present disclosure, a method for fabricating semiconductor devices is disclosed. The method can include detecting a position of a semiconductor wafer with respect to a movable blade by a sensor coupled to the movable blade. The method can include comparing the position of the semiconductor wafer to a position threshold. The method can include adjusting the position of the movable blade based on the comparison to the position threshold. The method can include adjusting the position of the movable blade to couple the semiconductor wafer to the movable blade. The method can include transporting the semiconductor wafer coupled to the movable blade.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a movable blade configured to receive a semiconductor wafer;

a positional sensor configured to detect a position of the semiconductor wafer on a surface of the movable blade, relative to a stationary body; and a plurality of temperature sensors to determine a temperature of a plurality of zones of the semiconductor wafer, the plurality of zones being concentrically spaced from one another;

wherein the movable blade is further configured to move with respect to the stationary body to cause a displacement of the semiconductor wafer relative to the movable blade; and wherein the positional sensor is physically coupled to the movable blade.

2. The device of claim 1, wherein:

the device comprises a vacuum interface to adhere the semiconductor wafer to the movable blade;

a vacuum of the vacuum interface is selectively disengageable; and the vacuum interface is configured to disengage the vacuum interface prior to the displacement of the semiconductor wafer relative to the movable blade, and thereupon engage the vacuum interface prior to a coupled movement of the semiconductor wafer and the movable blade.

3. The device of claim 2, wherein the positional sensor comprises:

a first sensor to detect a portion of a front opening unified pod (FOUP);

a second sensor to detect a gap between the semiconductor wafer and an additional semiconductor wafer; and a third sensor to detect a position of the FOUP in a direction perpendicular to the first sensor.

4. The device of claim 1, further comprising:

a contact sensor coupled to the movable blade to determine a temperature of the semiconductor wafer adhered thereto.

5. The device of claim 1, further comprising:

a non-contact sensor coupled to the movable blade to determine a temperature of the semiconductor wafer adhered thereto.

6. The device of claim 1, wherein:

the positional sensor is one of a plurality of positional sensors configured to detect an edge of the semiconductor wafer, wherein the plurality of positional sensors are irregularly spaced about a perimeter of the wafer.

7. The device of claim 1, wherein the plurality of temperature sensors are configured to:

collect temperature data for:

the semiconductor wafer adhered to the movable blade; or a temperature controlled chamber associated with the semiconductor wafer;

a memory device to store the temperature data; and one or more processors, configured to:

compare the temperature data to a threshold to determine whether the temperature data is within a temperature range; and adjust a temperature of the temperature controlled chamber, based on the determination of whether the temperature data is within the temperature range.

8. The device of claim 7, wherein the device comprises:

a machine learning model to ingest:

the temperature data for a plurality of semiconductor wafers; and yield data for the plurality of semiconductor wafers; and the machine learning model to determine an association between the temperature data and the yield data for the plurality of semiconductor wafers, wherein the threshold is adjusted, based on the determined association.

9. The device of claim 1, wherein:

the positional sensor comprises an image sensor, coupled to the movable blade, to generate positional image data for:

the semiconductor wafer adhered to the movable blade; or a chamber associated with the semiconductor wafer;

a memory device to store the positional image data; and one or more processors, configured to:

compare the positional image data to a threshold to determine whether the position of the semiconductor wafer is within a position range; and adjust the position of the semiconductor wafer, based on the determination of whether the position of the semiconductor wafer is within the position range.

10. The device of claim 9, further comprising:

a machine learning model to ingest:

the positional image data for a plurality of semiconductor wafers; and yield data for the plurality of semiconductor wafers;

wherein the machine learning model is configured to determine an association between the positional image data and the yield data for the plurality of semiconductor wafers; and wherein the threshold is adjusted, based on the determined association.

11. An assembly, comprising:

a movable blade;

a vacuum interface to adhere a semiconductor wafer to the movable blade;

a positional sensor configured to detect a lateral position of the semiconductor wafer relative to a surface of the movable blade; and a plurality of temperature sensors to determine temperatures of a plurality of zones of the semiconductor wafer.

12. The assembly of claim 11, further comprising a controller to:

adjust a position of the movable blade based on the lateral position of the semiconductor wafer.

13. The assembly of claim 11, further comprising a controller to:

adjust a chamber temperature based on the temperatures of the plurality of zones.

14. The assembly of claim 11, wherein the positional sensor comprises:

a first sensor to detect a portion of a front opening unified pod (FOUP);

a second sensor to detect a gap between the semiconductor wafer and an additional semiconductor wafer; and a third sensor to detect a position of the FOUP in a direction perpendicular to the first sensor.

* * * * *